(12) United States Patent
Bennett et al.

(10) Patent No.: US 7,969,196 B2
(45) Date of Patent: Jun. 28, 2011

(54) CIRCUITS AND METHODS FOR BUFFERING AND COMMUNICATING DATA SIGNALS

(75) Inventors: Paul T. Bennett, Phoenix, AZ (US); John M. Pigott, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/652,476

(22) Filed: Jan. 5, 2010

(65) Prior Publication Data

US 2010/0102852 A1 Apr. 29, 2010

Related U.S. Application Data

(62) Division of application No. 11/361,625, filed on Feb. 24, 2006, now Pat. No. 7,667,491.

(51) Int. Cl.
*H03K 19/094* (2006.01)
(52) U.S. Cl. ............... 326/83; 326/81; 326/56; 326/58
(58) Field of Classification Search ............ 326/17, 326/31, 33, 82, 83, 86, 87
See application file for complete search history.

(56) References Cited

U.S. PATENT DOCUMENTS

| | | | | |
|---|---|---|---|---|
| 4,464,589 A * | 8/1984 | Moriyasu et al. | ............ | 326/100 |
| 4,623,799 A | 11/1986 | Nyman, Jr. | | |
| 4,678,943 A | 7/1987 | Uragami et al. | | |
| 4,825,108 A * | 4/1989 | Burton et al. | ............ | 326/75 |
| 4,855,623 A | 8/1989 | Flaherty | | |
| 4,970,413 A * | 11/1990 | Eden et al. | ............ | 326/23 |
| 4,988,899 A * | 1/1991 | Jansson | ............ | 326/78 |
| 5,006,739 A | 4/1991 | Kimura et al. | | |
| 5,039,892 A | 8/1991 | Luich | | |
| 5,107,144 A * | 4/1992 | Hirayama | ............ | 326/83 |
| 5,140,192 A | 8/1992 | Nogle | | |
| 5,149,991 A | 9/1992 | Rogers | | |
| 5,159,426 A | 10/1992 | Harrington, III | | |
| 5,181,091 A | 1/1993 | Harrington, III | | |
| 5,216,294 A | 6/1993 | Ryu | | |
| 5,324,971 A | 6/1994 | Notley | | |
| 5,387,830 A | 2/1995 | Kukimoto | | |
| 5,495,198 A * | 2/1996 | Chen | ............ | 327/309 |
| 5,528,064 A | 6/1996 | Thiel et al. | | |
| 5,610,425 A * | 3/1997 | Quigley et al. | ............ | 257/358 |
| 5,631,579 A | 5/1997 | Miki et al. | | |
| 6,346,829 B1 * | 2/2002 | Coddington | ............ | 326/81 |
| 6,366,124 B1 | 4/2002 | Kwong | | |
| 6,560,081 B1 | 5/2003 | Vashchenko et al. | | |
| 7,027,332 B2 * | 4/2006 | Kuo et al. | ............ | 365/189.05 |
| 7,046,036 B2 * | 5/2006 | Chen et al. | ............ | 326/56 |

(Continued)

*Primary Examiner* — Rexford N Barnie
*Assistant Examiner* — Crystal L Hammond
(74) *Attorney, Agent, or Firm* — Ingrassia Fisher & Lorenz, P.C.

(57) ABSTRACT

Method and apparatus are provided for buffering a data signal to a low voltage logic device. A circuit for buffering the data signal to the low voltage logic device includes an output buffer and an N-type transistor. The output buffer has an input and an output, where the input is configured to receive the data signal. The output buffer is configured to produce an output signal based on the data signal, and the output signal has a maximum potential. The N-type transistor has a source coupled to the output, a drain configured to couple to the low voltage logic device, and a gate configured to receive a bias potential, where the bias potential is greater than the maximum potential.

15 Claims, 2 Drawing Sheets

U.S. PATENT DOCUMENTS

| | | |
|---|---|---|
| 7,068,091 B1 * | 6/2006 | Kwong ......................... 327/333 |
| 2003/0010528 A1 | 1/2003 | Niles |
| 2003/0085735 A1 | 5/2003 | Hagedorn |
| 2004/0216026 A1 | 10/2004 | Ferraiolo et al. |
| 2004/0265497 A1 | 12/2004 | Niles et al. |
| 2005/0275988 A1 | 12/2005 | Hunninghaus et al. |

* cited by examiner

CIRCUITS AND METHODS FOR BUFFERING AND COMMUNICATING DATA SIGNALS

RELATED APPLICATION

This application is a divisional of co-pending, U.S. patent application Ser. No. 11/361,625.

TECHNICAL FIELD

Embodiments generally relate to buffering data signals, and more particularly relate to circuits and methods for protecting output buffer devices.

BACKGROUND

Logic devices (e.g., a microprocessor providing digital data) generally operate within an output voltage range between about zero volts (0V) to about five volts (5V) or less to provide logic signals, and thus the logic device has a low voltage logic to enable higher switching speeds. The logic device receives a supply voltage that is generally derived from a battery voltage, and this supply voltage is typically substantially lower than the battery voltage. In some applications (e.g., automotive applications), the battery voltage is substantially greater than the output voltage range and the supply voltage for the logic device. For example, the battery voltage may be anywhere from about twelve volts (12V) to about twenty-eight volts (28V) or even greater.

Low voltage output buffers have been used to drive digital signals to logic devices with compliance between a low signal (e.g., about zero volts (0V)) and a high signal (e.g., about 2.5 to about five volts (5V)). In these buffers, the associated transistors that gate the supply voltage to the logic device may tolerate higher voltages than the logic device. In general, however, the greater the voltage, the slower the switching speeds of the transistors. When used in an automotive application or other application with more than one power supply, a short of the output buffer to the battery voltage may affect the reliability or disable the output buffer. For example, in an integrated circuit device, the port or pin corresponding to the output logic signal may be inadvertently connected (e.g., via improper soldering or incorrect PC board trace) to a port or pin designated to provide the battery voltage. Inadvertent coupling of the inputs to the logic device or the supply voltage inputs of the output buffer to these battery voltages would likely result in a short to the higher voltage and disable the output buffer.

Accordingly, a buffer circuit is desired that prevents damage to the buffer circuit from shorts to higher voltages while having sufficiently high switching speeds. More particularly, a buffer circuit for a low voltage logic device is desired that prevents damage to the buffer circuit from shorts to higher voltages. In addition, a method for buffering a signal to a low voltage logic device is desired that prevents damage from shorts to higher voltages. Furthermore, other desirable features and characteristics of the various embodiments will become apparent from the subsequent detailed description and the appended claims, taken in conjunction with the accompanying drawings and this background.

BRIEF DESCRIPTION OF THE DRAWINGS

Embodiments will hereinafter be described in conjunction with the following drawing figures, wherein like numerals denote like elements.

DETAILED DESCRIPTION

The following detailed description is merely exemplary in nature and is not intended to limit the inventive subject matter or the application and uses of the inventive subject matter. Furthermore, there is no intention to be bound by any theory presented in the preceding background or the following detailed description.

Embodiments include an apparatus and method for protecting the switching components of an output buffer (e.g., low-voltage high-speed transistors) from being coupled to a potential substantially greater than the proper operating range of such switching components, such as the battery voltage in a vehicle. In one exemplary embodiment, the apparatus comprises an output buffer having a supply input, a data output, and one or more isolation transistors coupled to at least one of the supply input and the data output. The output buffer is configured to couple to a low-voltage logic device at the data output. The isolation transistors are selected to have an operating range that permits biasing of such isolation transistors at a potential to prevent damage to the low-voltage high-speed transistors from shorts of the supply input and/or the data output to a battery voltage.

Figure 1:
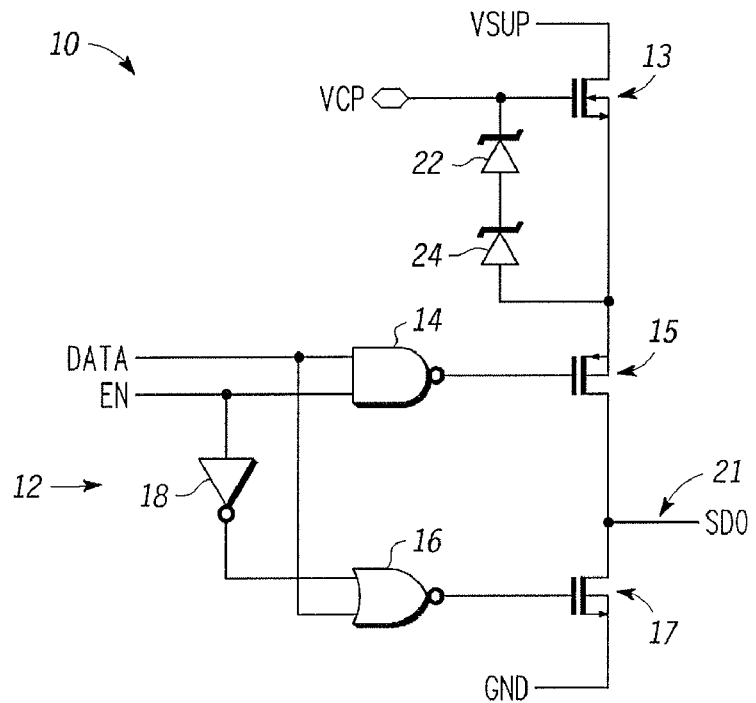
FIG. 1 is a circuit diagram of an exemplary embodiment of a supply-protected output buffer circuit in accordance with an embodiment.

Referring to the drawings, FIG. 1 is a circuit diagram of an exemplary embodiment of a supply-protected output buffer circuit 10 in accordance with an embodiment. The output buffer circuit 10 comprises an output buffer 12, an isolation transistor 13, connected to a supply input of output buffer 12, and one or more Zener diodes 22, 24 having a cathode coupled to a gate of isolation transistor 13 and an anode coupled to a source of isolation transistor 13. Output buffer 12 comprises a first driver transistor 15 having a source coupled to the source of isolation transistor 13, a second driver transistor 17 having a drain coupled to a drain of driver transistor 15, NAND logic 14 having an output coupled to the gate of driver transistor 15, NOR logic 16 having an output coupled to the gate of driver transistor 17, and an inverter 18 having an output coupled to a first input of NOR logic 16. A drain of isolation transistor 13 is configured to receive a supply potential (VSUP), and isolation transistor 13 is configured to supply this supply potential (VSUP) to the source of driver transistor 15 when a gate of isolation transistor 13 is biased at a predetermined potential. Although NAND and NOR logics 14 and 16 are paired with driver transistors 17 and 15, a variety of logic devices and configurations of logic devices may be used with driver transistors 17 and 15. Output buffer 12 includes first and second inputs configured to receive a data signal and an enable signal, respectively, and the drains of driver transistors 17 and 15 join to form an output 21 configured to couple with a low voltage logic device.

Output buffer 12 is a tri-state output buffer that buffers the data signal and produces an output signal (SDO) at the output 21 based on the enable signal. For example, the output signal (SDO) indicates one of a logic zero (0) or a logic one (1), corresponding with the logic indicated by the data signal, when the enable signal indicates an enabled state. The output signal (SDO) indicates no information when the enable signal indicates a non-enabled state regardless of the logic indicated by the data signal. In this exemplary embodiment, although output buffer 12 is shown as a tri-state (e.g., a current-sourcing mode, a current-sinking mode, and a floating mode) output buffer, a two-state output buffer may be used with output buffer circuit 10 that operates in two modes (e.g., current-sourcing mode and current-sinking mode). NAND logic 14 receives the data and enable signals and NANDs these signals to produce a first signal at the gate of driver transistor 15, and NOR logic 16 receives the data signal and an inverted enable signal (e.g., via inverter 18) and NORs these signals to produce a second signal at the gate of driver transistor 17. The first and second signals vary between two values, a high value (e.g., a predetermined positive potential) and a low value (e.g., zero volts (0V)). The high value biases the gate of driver transistor 15 to close and biases the gate of driver transistor 17 to allow current to flow from the drain to the source of driver transistor 17. The low value biases the gate of driver transistor 17 to close and biases the gate of driver transistor 15 to allow current to flow from the source to the drain of driver transistor 15.

From the possible combinations of the data and enable signals supplied to output buffer 12, three different combinations of first and second signals are produced corresponding to the three possible types of output signal (SDO) (e.g., logic zero (0), logic one (1), and no information). When the first signal is a high value and the second signal is a high value, current flows from the drain to the source of driver transistor 17 but does not flow from the source to the drain of driver transistor 15. In this case, the potential at output 21 corresponds to zero volts (0V) based on the ground at the source of driver transistor 17 to indicate a logic zero (0). When the first signal is a low value and the second signal is a low value, current flows from the source to the drain of driver transistor 15 but does not flow from the drain to the source of driver transistor 17. In this case, the potential at output 21 is based on the potential (VSUP) supplied to the source of driver transistor 15 to indicate a logic one (1). When the first signal is a high value and the second signal is a low value, current does not flow across driver transistors 15 and 17. In this case, neither zero volts (0V) or the potential (VSUP) is produced at output 21 thereby indicating no information. From these types of output signals (SDO), the operating range of output buffer 12 is from about zero volts (0V) to about the potential (VSUP), and the potential (VSUP) is based on the maximum potential that may be supplied to a low-voltage logic device coupled to output 21.

In output buffer 12, driver transistor 17 is a positive-channel metal oxide semiconductor (PMOS) transistor and driver transistor 15 is a negative-channel metal oxide semiconductor (NMOS) transistor. Both driver transistors 17 and 15 preferably have a low voltage operating range (e.g., from about zero volts (0V) to about 3.3V or about five volts (5V)) for faster switching speeds. Isolation transistor 13 is an negative-channel metal oxide semiconductor (NMOS) transistor, and is preferably an NMOS supporting an operating range that is greater than the operating range of driver transistors 17 and 15 (e.g., from about zero volts (0V) to about ten volts (10V)). A higher operating range can be characterized by a capacity of the transistor to accept a higher potential at the gate of the transistor. NMOS transistors that are larger in size generally have higher operating ranges than smaller NMOS transistors, and thus NMOS transistors that are larger than driver transistor 17 are preferably selected for isolation transistor 13. Additionally, other NMOS transistors, such as an N-type lateral double-diffused MOS (LDMOS) and the like, that support high voltages while having low on-resistance may be used for isolation transistor 13. Because the operating range of isolation transistor 13 is higher than the operating range of driver transistor 17, the switching speed of isolation transistor 13 is slower than the higher switching speed of driver transistors 17 and 15. A voltage bias supply coupled to the gate of isolation transistor 13 biases the gate of isolation transistor 13 at a predetermined bias potential (e.g., about ten volts (10V)). Zener diodes 22 and 24 protect the gate oxide of isolation transistor 13 from transient voltages that might be present on the voltage bias supply connection, such as electrostatic discharge (ESD) pulses inadvertently applied to the voltage bias supply connection. In another exemplary embodiment, Zener diodes 22 and 24 are excluded when the bias potential from the voltage bias supply does not exceed the gate oxide breakdown voltage of isolation transistor 13.

In operation, the gate of isolation transistor 13 is configured to receive the predetermined bias potential (e.g., a charge pumped voltage (VCP)) from the voltage bias supply. When the gate of isolation transistor 13 receives this bias potential, the potential (VSUP) is supplied to the source of driver transistor 15. The bias potential is at least greater than the combination of the potential (VSUP) to be supplied to the source of driver transistor 15 and the threshold potential associated with isolation transistor 13, and the bias potential is preferably sufficiently greater than this combination such that the on-resistance of isolation transistor 13 appears insignificant and minimally affects the potential at the source of isolation transistor 13. The bias potential supplied to the gate of isolation transistor 13 is thus greater than the potential supplied to output buffer 12 at the source of driver transistor 15. Isolation transistor 13 is selected such that the bias potential applied to the gate of isolation transistor 13 is at least greater than the combination of the potential (VSUP) and the threshold potential of isolation transistor 13. In the event that the supply (e.g., via the drain of isolation transistor 13) to output buffer circuit 10 is shorted to a substantially greater potential (e.g., a battery voltage) than the desired supply potential, isolation transistor 13 prevents damage to driver transistors 17 and 15 by limiting the current flowing from the drain to the source of isolation transistor 13. For example, as the supply potential (VSUP) increases to the saturation region of isolation transistor 13, the current flowing from the drain to the source of isolation transistor 13 substantially tapers to a maximum current. This current limiting in turn limits the potential produced at the source of isolation transistor 13, and thus the supply potential supplied to output buffer 12 at the source of driver transistor 15, to a value less than about the difference of the bias potential (e.g., charge pumped voltage (VCP)) and the threshold potential.

Figure 2:
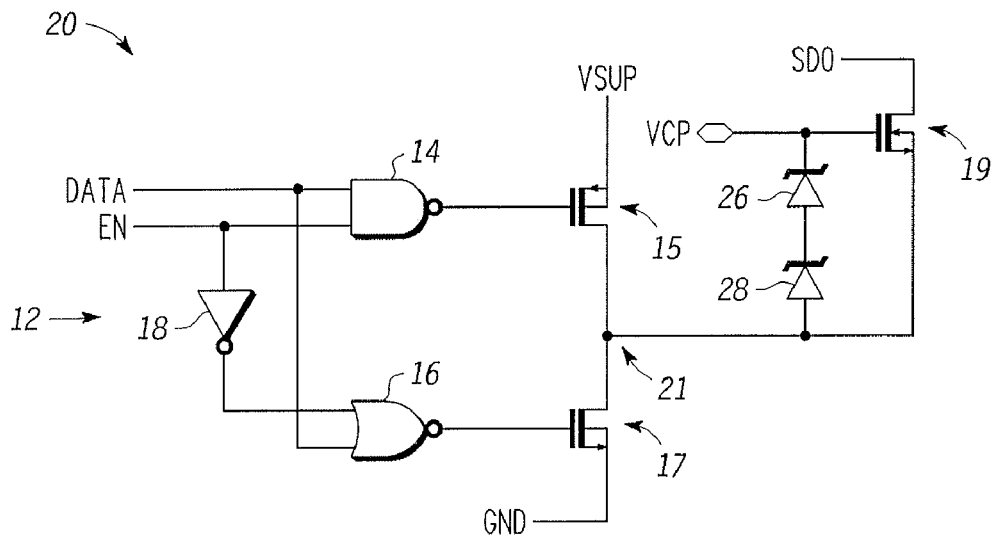
FIG. 2 is a circuit diagram of an exemplary embodiment of an output-protected output buffer circuit in accordance with an embodiment.

FIG. 2 is a circuit diagram of an exemplary embodiment of an output-protected output buffer circuit 20 in accordance with an embodiment. Output buffer circuit 20 comprises output buffer 12, an isolation transistor 19 having a source coupled to the output of output buffer 12, and one or more Zener diodes 26, 28 having a cathode coupled to a gate of isolation transistor 19 and an anode coupled to the output of output buffer 12. Like isolation transistor 13 shown in FIG. 1, isolation transistor 19 is an NMOS transistor, such as a high voltage lateral N-type double-diffused MOS (DMOS), and preferably supports an operating range that is greater than the operating range of driver transistors 17 and 15 (e.g., from about zero volts (0V) to about ten volts (10V)). Isolation transistor 19 is selected based on a pre-determined maximum potential produced at output 21 and thus supplied to the source of isolation transistor 19. In this exemplary embodiment, the maximum potential produced at output 21 is the potential (VSUP) corresponding to a logic one (1) signal, and isolation transistor 19 is selected such that the bias potential applied to the gate of isolation transistor 19 is at least greater than the combination of the potential (VSUP) and the threshold potential of isolation transistor 19. Zener diodes 26 and 28 protect the gate oxide of isolation transistor 19 from transient voltages that might be present on the voltage bias supply connection to isolation transistor 19. Zener diodes 26 and 28 are excluded when the bias potential from the voltage bias supply does not exceed the gate oxide breakdown voltage of isolation transistor 19.

In operation, a drain of isolation transistor 19 is configured to couple to the low voltage logic device to provide the output signal (SDO), and the gate of isolation transistor 19 is configured to receive the predetermined bias potential. In this exemplary embodiment, the bias potential of the gate of isolation transistor 19 is greater than the combination of the potential (VSUP) and the threshold potential, and the bias potential is preferably sufficiently greater than this combination such that the on-resistance of isolation transistor 19 appears insignificant and minimally affects the potential at the source of isolation transistor 19. The potential received at the gate of isolation transistor 19 is thus greater than the potential (VSUP) supplied to output buffer 12 via the source of driver transistor 15. In the event that the output 21 of output buffer 12 is shorted (e.g., via the drain of isolation transistor 19) to a substantially greater potential (e.g., a battery voltage) than the desired supply potential, isolation transistor 19 prevents damage to driver transistors 17 and 15 by limiting the current flowing from the drain to the source of isolation transistor 19. For example, as the potential produced at the drain of isolation transistor 19 increases to the saturation region of isolation transistor 19, the current flowing from the drain to the source of isolation transistor 13 substantially tapers to a maximum current. This current limiting in turn limits the potential produced at the source of isolation transistor 19, and thus the potential that may appear at the output 21 of output buffer 12, to a value that is less than about the difference of the bias potential and the threshold potential of isolation transistor 19.

Figure 3:
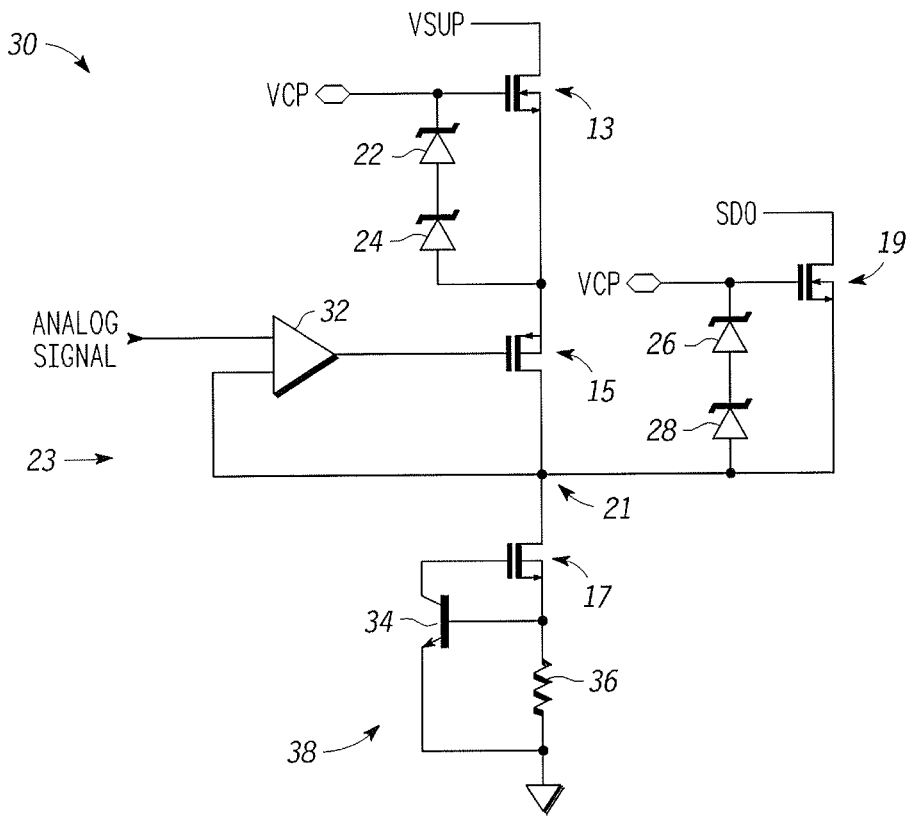
FIG. 3 is a circuit diagram of another exemplary embodiment of an output buffer circuit in accordance with an embodiment.

FIG. 3 is a circuit diagram of another exemplary embodiment of an output buffer circuit 30 in accordance with an embodiment. Although FIGS. 1 and 2 show output buffer 12 with digital logic inputs (e.g., NAND logic 14 and NOR logic 16), analog versions of the digital logic inputs may be used with output buffer circuit 30. Additionally, although FIGS. 1 and 2 show the individual incorporation of isolation transistors 13 and 19, respectively, with output buffer 12, isolation transistors 13 and 19 may be incorporated together into output buffer circuit 30. In this exemplary embodiment, output buffer circuit 30 comprises driver transistors 17 and 15, an operational amplifier (OPAMP) 32 coupled to driver transistors 17 and 15, and isolation transistors 13 and 19. Additionally, a current limiter 38 is coupled to driver transistor 17 for regulating the current at the source of driver transistor 17. Although current limiter 38 is incorporated into output buffer circuit 30, other circuits for regulating current at the source of driver transistor 17 may be substituted in place of current limiter 38, such as a current detector and the like. OPAMP 32 and driver transistors 17 and 15 together form an output buffer 23 for analog signals. Isolation transistor 13 is coupled to a supply input (e.g., the source of driver transistor 15) of output buffer 23 to limit the potential produced at the source of isolation transistor 13 and thus the supply potential supplied to output buffer 23 at the source of driver transistor 15. The supply potential supplied to output buffer 23 is limited to a value less than about the difference of the bias potential (e.g., charge pumped voltage (VCP)) and the threshold potential. Isolation transistor 19 is coupled to an output 21 (e.g., the drains of driver transistors 17 and 15) of output buffer 23 to limit the potential produced at the source of isolation transistor 19 (e.g., from a short of the output 21 via the drain of isolation transistor 19) and thus the potential that may appear at output 21 of output buffer 12. The potential that may appear at output 21 is limited to a value that is less than about the difference of the bias potential and the threshold potential of isolation transistor 19.

In this exemplary embodiment, OPAMP 32 has a first input configured to receive an analog input signal, a second input coupled to the drains of both driver transistors 17 and 15, and an output coupled to the gate of driver transistor 15. Current limiter 38 comprises a transistor 34 having a collector coupled to the gate of driver transistor 17 and a resistor 36 having a first terminal coupled to a base of transistor 34 and a second terminal coupled to an emitter of transistor 34. The base of transistor 34 is also coupled to the source of driver transistor 17, and the emitter of transistor 34 is coupled to a reference potential (e.g., ground).

Figure 4:
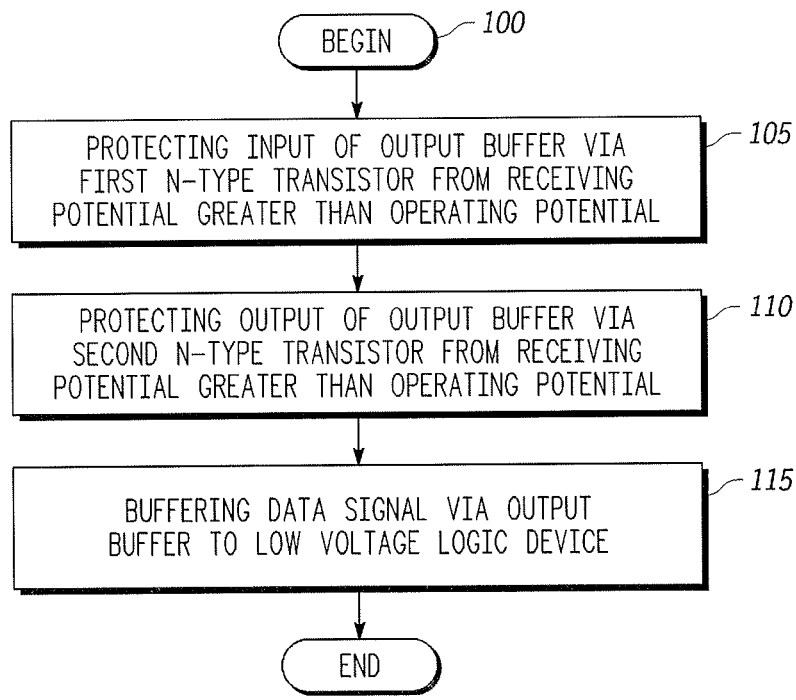
FIG. 4 is a flow diagram of a method of communicating a data signal to a low voltage logic device in accordance with an exemplary embodiment.

FIG. 4 is a flow diagram of a method 100 of communicating a data signal to a low voltage logic device in accordance with an exemplary embodiment. The data signal is buffered via the output buffer to the low voltage logic device at step 115. An input (e.g., voltage supply) of the output buffer is protected via a first N-type transistor from receiving a potential greater than an operating potential (e.g., a maximum operating potential) of the output buffer at step 105. The gate of the first N-type transistor is biased at a potential that is greater than the operating potential. The first N-type transistor produces, at the input of the output buffer, a supply potential less than or equal to about the operating potential when the drain of the first N-type transistor receives the first potential (e.g., when the supply pin is coupled to a battery). An output of the output buffer is protected via a second N-type transistor from receiving a second potential greater than the operating potential at step 110. The gate of the second N-type transistor is biased at a potential greater than the operating potential. The second N-type transistor produces, at the output of the output buffer, a potential less than or equal to about the operating potential when the drain of the second N-type transistor receives the second potential (e.g., when the output pin is coupled to a battery). Although the method 100 is described as both protecting the input of the output buffer and protecting the output of the output buffer, the input of the output buffer may solely be protected or the output of the output buffer may solely be protected. In one exemplary embodiment, while buffering the data signal, a supply potential is provided via an isolation transistor to the output buffer at step 110. The gate of the isolation transistor is biased at a first potential that is at least greater than a combination of the potential at the source of the isolation transistor and a threshold potential (e.g., the threshold potential of the diodes 22 and 24 between the gate and source of the isolation transistor 13). When biasing the gate of the isolation transistor, the first potential is selected to minimize an operating or "on" resistance of the first transistor. In another exemplary embodiment, while buffering the data signal, an output signal is transmitted via an isolation transistor at the output of the output buffer to the low voltage logic device at step 115. The gate of the second transistor is biased at a second potential at least greater than a combination of the potential at the source of the second transistor and the threshold potential (e.g., the threshold potential of the diodes 26 and 28 between the gate and source of the isolation transistor 19).

When biasing the gate of the second transistor, the second potential is selected to minimize an operating or "on" resistance of the second transistor. In another exemplary embodiment, steps 110 and 115 are performed together while buffering the data signal. For example, the supply potential is provided via a first isolation transistor to the output buffer and the output signal is transmitted via a second isolation transistor at the output of the output buffer to the low voltage logic device while buffering the data signal.

In an exemplary embodiment, a circuit for buffering a data signal to a low voltage logic device is provided comprising an output buffer having a first input, a voltage input and an output, and a first N-type transistor having a source coupled to the second input. The first input is configured to receive the data signal, the voltage input is configured to receive a supply potential, and the output is configured to couple to the low voltage logic device. The first transistor has a drain configured to receive a first potential and is configured to supply a second potential to the output buffer when the gate receives a bias potential. The second potential is based on the first potential, and the bias potential is greater than the supply potential. The first transistor is configured to protect the output buffer at the voltage input when the second potential is greater than the supply potential. When the drain receives the first potential greater than the supply potential, the first transistor limits the second potential to the supply potential. The circuit may further comprise at least one diode having a cathode coupled to the gate and having an anode coupled to the source. The first transistor is a high voltage lateral N-type double-diffused metal oxide semiconductor. In one exemplary embodiment, the output buffer comprises second and third transistors, a NAND gate, and a NOR gate. The second transistor has a source coupled to the source of the first transistor, a drain, and a gate configured to receive a first signal. The NAND gate has an input configured to receive the data signal and has an output coupled to the gate of the second transistor. The NAND gate is configured to NAND the data signal to produce the first signal. The third transistor has a drain coupled to the drain of the second transistor forming the output of the output buffer, a source configured to couple to a third potential, and a gate configured to receive a second signal. The NOR gate has an input configured to receive the data signal and has an output coupled to the gate of the third transistor. The NOR gate is configured to NOR the data signal to produce the second signal. The second and third transistors have an operating range, and the maximum potential is based on the operating range. In another exemplary embodiment, the output buffer may comprise second, third, and fourth transistors, and a resistor. The second transistor has a source coupled to the source of the first transistor, a drain, and a gate configured to receive a first signal. The third transistor has a drain coupled to the drain of the second transistor forming the output of the output buffer, a source, and a gate configured to receive a second signal. The fourth transistor has a collector coupled to the gate of the third transistor, a base coupled to the source of the third transistor, and an emitter configured to couple to the third potential. The resistor has a first terminal coupled to the base of the fourth transistor and has a second terminal coupled to the emitter of the fourth transistor and configured to couple to the third potential. In another exemplary embodiment, the output buffer comprises second and third transistors and an operational amplifier. The second transistor has a source coupled to the source of the first transistor, a drain, and a gate. The third transistor has a drain coupled to the drain of the second transistor, a source configured to couple to a third potential, and a gate. The operational amplifier has a first input configured to receive the data signal, a second input coupled to the drain of the third transistor, and an output coupled to the gate of the second transistor.

In another exemplary embodiment, a circuit for buffering a data signal to a low voltage logic device is provided comprising an output buffer having an input and an output and a first N-type transistor having a source coupled to the output. The input is configured to receive the data signal. The output buffer is configured to produce an output signal based on the data signal, and the output signal has a maximum potential. The first transistor has a drain configured to couple to the low voltage logic device and has a gate configured to receive a bias potential. The bias potential is greater than the maximum potential. The first transistor is configured to protect the output buffer at the output when the drain receives a potential greater than the maximum potential. When the drain receives a potential greater than the maximum potential, the first transistor produces an output potential at the source that is equal to or less than the maximum potential. The circuit may further comprise at least one diode having a cathode coupled to the gate and having an anode coupled to the source. In one exemplary embodiment, the output buffer comprises second and third transistors, a NAND gate, and NOR gate. The second transistor has a source configured to couple to a first potential, a drain coupled to the source of the first transistor, and a gate configured to receive a first signal. The NAND gate has an input configured to receive the data signal and has an output coupled to the gate of the second transistor. The NAND gate is configured to NAND the data signal to produce the first signal. The third transistor has a drain coupled to the drain of the second transistor to form the output of the output buffer, a source configured to couple to a second potential, and a gate configured to receive a second signal. The NOR gate has an input configured to receive the data signal and has an output coupled to the gate of the third transistor. The NOR gate is configured to NOR the data signal to produce the second signal. The second and third transistors have an operating range, and the maximum potential is based on the operating range. In another exemplary embodiment, the output buffer comprises second, third, and fourth transistors, and a resistor. The second transistor has a source configured to couple to a first potential, a drain coupled to the source of the first transistor, and a gate configured to receive a first signal. The third transistor has a drain coupled to the drain of the second transistor and the source of the first transistor, a source, and a gate. The fourth transistor has a collector coupled to the gate of the third transistor, a base coupled to the source of the third transistor, and an emitter configured to couple to a second potential. The resistor has a first terminal coupled to the base of the fourth transistor and the source of the third transistor and has a second terminal coupled to the emitter of the fourth transistor and configured to couple to the second potential. In another exemplary embodiment, the output buffer comprises second and third transistors and an operational amplifier. The second transistor has a source configured to coupled to a first potential, a drain coupled to the source of the first transistor, and a gate. The third transistor has a drain coupled to the drain of the second transistor and the source of the first transistor, a source configured to couple to a second potential, and a gate. The operational amplifier has a first input configured to receive the data signal, a second input coupled to the drain of the third transistor, and an output coupled to the gate of the second transistor.

In another exemplary embodiment, a method for communicating a data signal from an output buffer to a low voltage logic device is provided comprising the steps of at least one of protecting an input of the output buffer via a first N-type transistor from receiving a first potential greater than an operating potential of the output buffer and protecting an output of the output buffer via a second N-type transistor from receiving a second potential greater than the operating potential, and buffering the data signal via the output buffer to the low voltage logic device. The step of protecting the input comprises biasing the gate of the first N-type transistor at a third potential greater than the operating potential. The first N-type transistor produces at the input a fourth potential less than or equal to about the operating potential when the drain of the first N-type transistor receive the first potential greater than the operating potential. The step of protecting the output comprises biasing the gate of the second N-type transistor at a third potential greater than the operating potential. The second N-type transistor produces at the output a fourth potential less than or equal to about the operating potential when the drain of the second N-type transistor receives the second potential greater than the operating potential.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the embodiments in any way. Rather, the foregoing detailed description will provide those skilled in the art with a convenient road map for implementing the exemplary embodiment or exemplary embodiments. It should be understood that various changes can be made in the function and arrangement of elements without departing from the scope of the inventive subject matter as set forth in the appended claims and the legal equivalents thereof.

What is claimed is:

1. A circuit for buffering a data signal to a low voltage logic device, the circuit comprises:
    an output buffer having a voltage input configured to receive a supply potential, an input configured to receive the data signal, and having an output, said output buffer configured to produce an output signal based on the data signal, said output signal having a maximum potential;
    a first N-type transistor having a source coupled to said output, a drain configured to couple to the low voltage logic device, and a gate configured to receive a predetermined bias potential, said predetermined bias potential greater than said maximum potential and greater than said supply potential; and
    at least one diode having a cathode coupled to said gate and having an anode coupled to said source.

2. A circuit according to claim 1, wherein said first transistor is configured to protect said output buffer at said output when said drain receives a potential greater than said maximum potential.

3. A circuit according to claim 1, wherein when said drain receives a potential greater than said maximum potential, said first transistor produces an output potential at said source, said output potential equal to or less than said maximum potential.

4. A circuit according to claim 1, wherein said output buffer comprises:
    a second transistor having a source configured to couple to a first potential, a drain coupled to said source of said first transistor, and a gate configured to receive a first signal;
    a NAND gate having an input configured to receive the data signal and having an output coupled to said gate of said second transistor, said NAND gate configured to NAND the data signal to produce said first signal;
    a third transistor having a drain coupled to said drain of said second transistor and said source of said first transistor, a source configured to couple to a second potential, and a gate configured to receive a second signal; and
    a NOR gate having an input configured to receive the data signal and having an output coupled to said gate of said third transistor, said NOR gate configured to NOR the data signal to produce said second signal.

5. A circuit according to claim 4, wherein said second and third transistors have an operating range, and wherein said maximum potential is based on said operating range.

6. A circuit according to claim 4, wherein an operating range of the first N-type transistor is greater than operating ranges of the second and third transistors.

7. A circuit according to claim 1, wherein said output buffer comprises:
    a second transistor having a source configured to couple to a first potential, a drain coupled to said source of said first transistor, and a gate configured to receive a first signal;
    a third transistor having a drain coupled to said drain of said second transistor and said source of said first transistor, a source, and a gate configured to receive a second signal;
    a fourth transistor having a collector coupled to said gate of said third transistor, a base coupled to said source of said third transistor, and an emitter configured to couple to a second potential; and
    a resistor having a first terminal coupled to said base of said fourth transistor and said source of said third transistor and having a second terminal coupled to said emitter of said fourth transistor and configured to couple to said second potential.

8. A circuit according to claim 1, wherein said output buffer comprises:
    a second transistor having a source configured to couple to a second potential, a drain coupled to said source of said first transistor, and a gate;
    a third transistor having a drain coupled to said drain of said second transistor and said source of said first transistor, a source configured to couple to a second potential, and a gate; and
    an operational amplifier having a first input configured to receive the data signal, a second input coupled to said drain of said third transistor, and an output coupled to said gate of said second transistor.

9. A method for communicating a data signal from an output buffer to a low voltage logic device, the output buffer having an operating potential, the method comprising the steps of:
    protecting an input of the output buffer via an N-type transistor from receiving a first potential greater than the operating potential, wherein the N-type transistor includes a source, a gate, and a drain, the source is coupled to the input to receive a first supply potential, the drain is configured to receive a second supply potential, and the gate is coupled to a predetermined bias potential that is greater than the first supply potential;
    protecting the gate from transient voltages via at least one diode having a cathode coupled to the gate and having an anode coupled to the source; and
    buffering the data signal via the output buffer to the low voltage logic device.

10. A method according to claim 9, wherein said step of protecting the input comprises biasing the gate of the N-type transistor at a third potential greater than the operating potential, and wherein the N-type transistor produces at the input a fourth potential less than or equal to about the operating potential when the drain of the N-type transistor receives the first potential greater than the operating potential.

11. A method for communicating a data signal from an output buffer to a low voltage logic device, the output buffer having an operating potential, the method comprising the steps of:
- protecting an output of the output buffer via an N-type transistor from receiving a second potential greater than the operating potential, wherein the N-type transistor includes a source, a gate, and a drain, the source is coupled to the output of the output buffer, the drain is configured to couple to the low voltage logic device, and the gate is coupled to the predetermined bias potential;
- protecting the gate from transient voltages via at least one diode having a cathode coupled to the gate and having an anode coupled to the source; and
- buffering the data signal via the output buffer to the low voltage logic device.

12. A circuit for buffering a data signal to a low voltage logic device, the circuit comprises:
- an output buffer having a voltage input configured to receive a supply potential, an input configured to receive the data signal, and having an output, said output buffer configured to produce an output signal based on the data signal, said output signal having a maximum potential;
- an isolation transistor having a source coupled to said output, a drain configured to couple to the low voltage logic device, and a gate configured to receive a predetermined bias potential, said predetermined bias potential greater than said maximum potential and greater than said supply potential; and
- at least one diode that includes a cathode coupled to the gate and an anode coupled to the source.

13. A circuit according to claim 12, wherein the output buffer comprises:
- a second transistor having a source configured to couple to a first potential, a drain coupled to the source of the isolation transistor, and a gate configured to receive a first signal;
- a NAND gate having an input configured to receive the data signal and having an output coupled to the gate of the second transistor, the NAND gate configured to NAND the data signal to produce the first signal;
- a third transistor having a drain coupled to the drain of the second transistor and the source of the isolation transistor, a source configured to couple to a second potential, and a gate configured to receive a second signal; and
- a NOR gate having an input configured to receive the data signal and having an output coupled to the gate of the third transistor, the NOR gate configured to NOR the data signal to produce the second signal.

14. A circuit according to claim 13, wherein an operating range of the isolation transistor is greater than operating ranges of the second and third transistors.

15. A method according to claim 11, wherein said step of protecting the output comprises biasing the gate of the N-type transistor at a third potential greater than the operating potential, and wherein the N-type transistor produces at the output a fourth potential less than or equal to about the operating potential when the drain of the N-type transistor receives the second potential greater than the operating potential.

* * * * *